United States Patent [19]
Sakai et al.

[11] Patent Number: 5,929,643
[45] Date of Patent: Jul. 27, 1999

[54] SCANNING PROBE MICROSCOPE FOR MEASURING THE ELECTRICAL PROPERTIES OF THE SURFACE OF AN ELECTRICALLY CONDUCTIVE SAMPLE

[75] Inventors: Nobuaki Sakai; Katsuhiro Matsuyama, both of Hachioji, Japan

[73] Assignee: Olympus Optical Co., Ltd., Tokyo, Japan

[21] Appl. No.: 08/757,131

[22] Filed: Dec. 3, 1996

[30] Foreign Application Priority Data

Dec. 7, 1995 [JP] Japan .................................. 7-319124
Dec. 18, 1995 [JP] Japan .................................. 7-328970

[51] Int. Cl.$^6$ ................................................. G01R 11/00
[52] U.S. Cl. ........................................ 324/750; 324/754
[58] Field of Search ................................. 324/750, 758, 324/754, 767, 662; 250/306, 307, 423 F; 73/105

[56] References Cited

U.S. PATENT DOCUMENTS

| Re. 33,387 | 10/1990 | Binnig . | |
|---|---|---|---|
| 4,861,990 | 8/1989 | Coley ........................................ | 250/306 |
| 5,021,364 | 6/1991 | Akamine et al. . | |
| 5,051,379 | 9/1991 | Bayer et al. . | |
| 5,185,572 | 2/1993 | Yagi et al. ................................. | 324/750 |
| 5,304,924 | 4/1994 | Yamano et al. ........................... | 324/758 |
| 5,742,172 | 4/1998 | Yasutake .................................. | 324/750 |

FOREIGN PATENT DOCUMENTS

WO 92/12398  7/1992  WIPO .

OTHER PUBLICATIONS

G. Binnig et al; "Atomic Force Mircroscope"; Mar. 1986; pp. 930–933; Physical Review Letters, vol. 56, No. 9.
J.R. Kirtley et al; "Direct Measurement of Potential Steps at Grain Boundaries in the Presence of Current Flow"; Apr. 1988; pp. 1546–1549; Physical Review Letters; vol. 60, No. 15.
T.R. Albrecht et al; "Microfabrication of Cantilever Styli for the Atomic Force Microscope"; Jul./Aug. 1990; pp. 3386–3396; J. Vac. Sci. Technol. A8.
S. Akamine et al; "Improved Atomic Force Microscope Images Using Microcantilevers with Sharp Tips"; Jul. 1990; pp. 316–318; Appl. Phys. Lett. 57(3).

*Primary Examiner*—Vinh P. Nguyen
*Attorney, Agent, or Firm*—Frishauf, Holtz, Goodman, Langer & Chick

[57] ABSTRACT

A scanning probe microscope for measuring the electrical properties of the surface of a sample comprises a first sensor for detecting electrical information for the sample surface and outputting a first electrical signal corresponding thereto, the first sensor including an electrically conductive probe located near the surface of the sample, a second sensor for detecting the distance between the probe and the sample and outputting a second electrical signal corresponding thereto, an actuator for relatively moving the probe and the sample in a three-dimensional manner, a servo control mechanism for adjusting the distance between the probe and the sample to a desired value by servo control in accordance with the second electrical signal while the electrical information is being detected by the first sensor, and a processing unit for processing the first electrical signal.

15 Claims, 11 Drawing Sheets

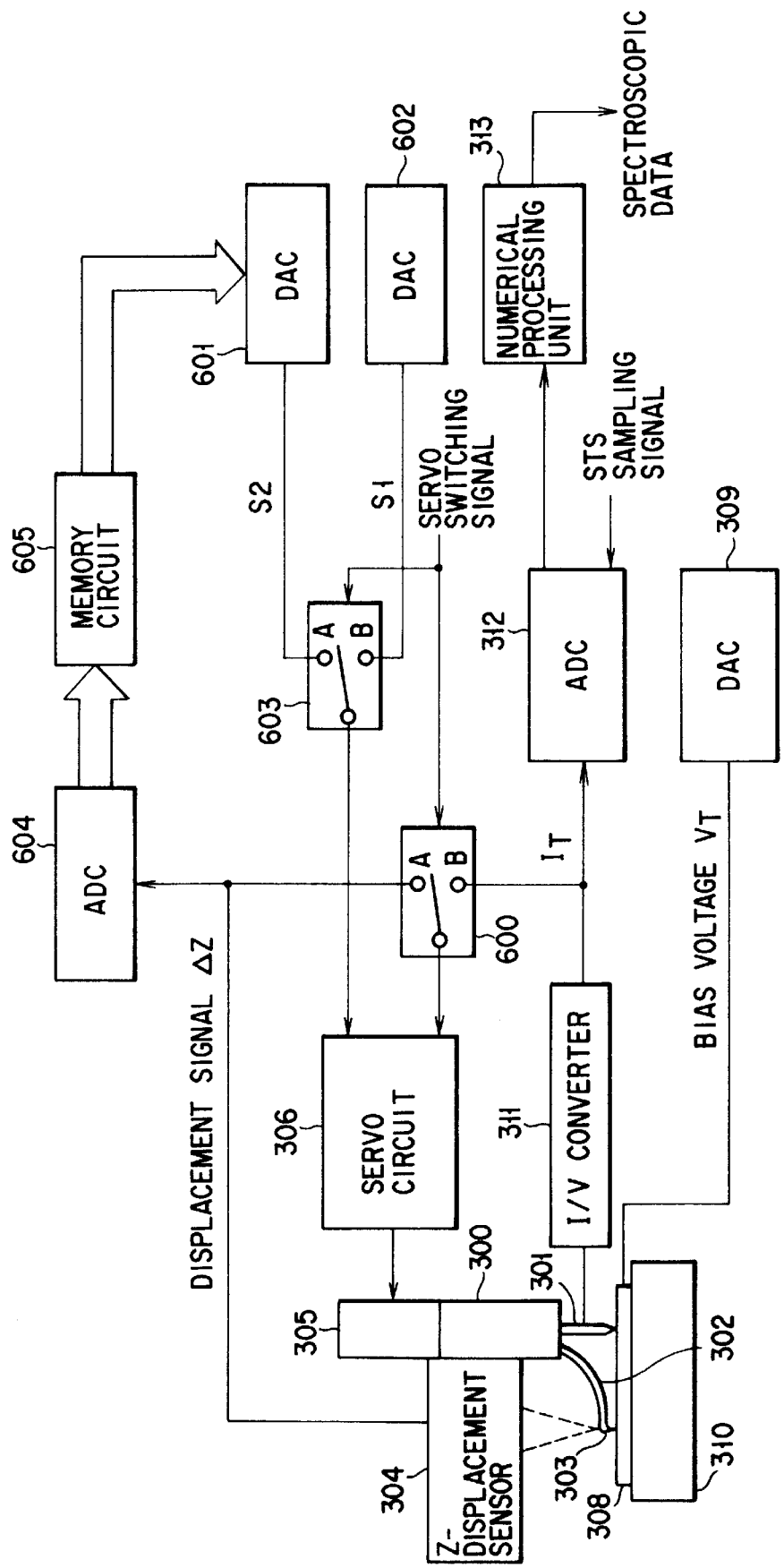
F I G. 1

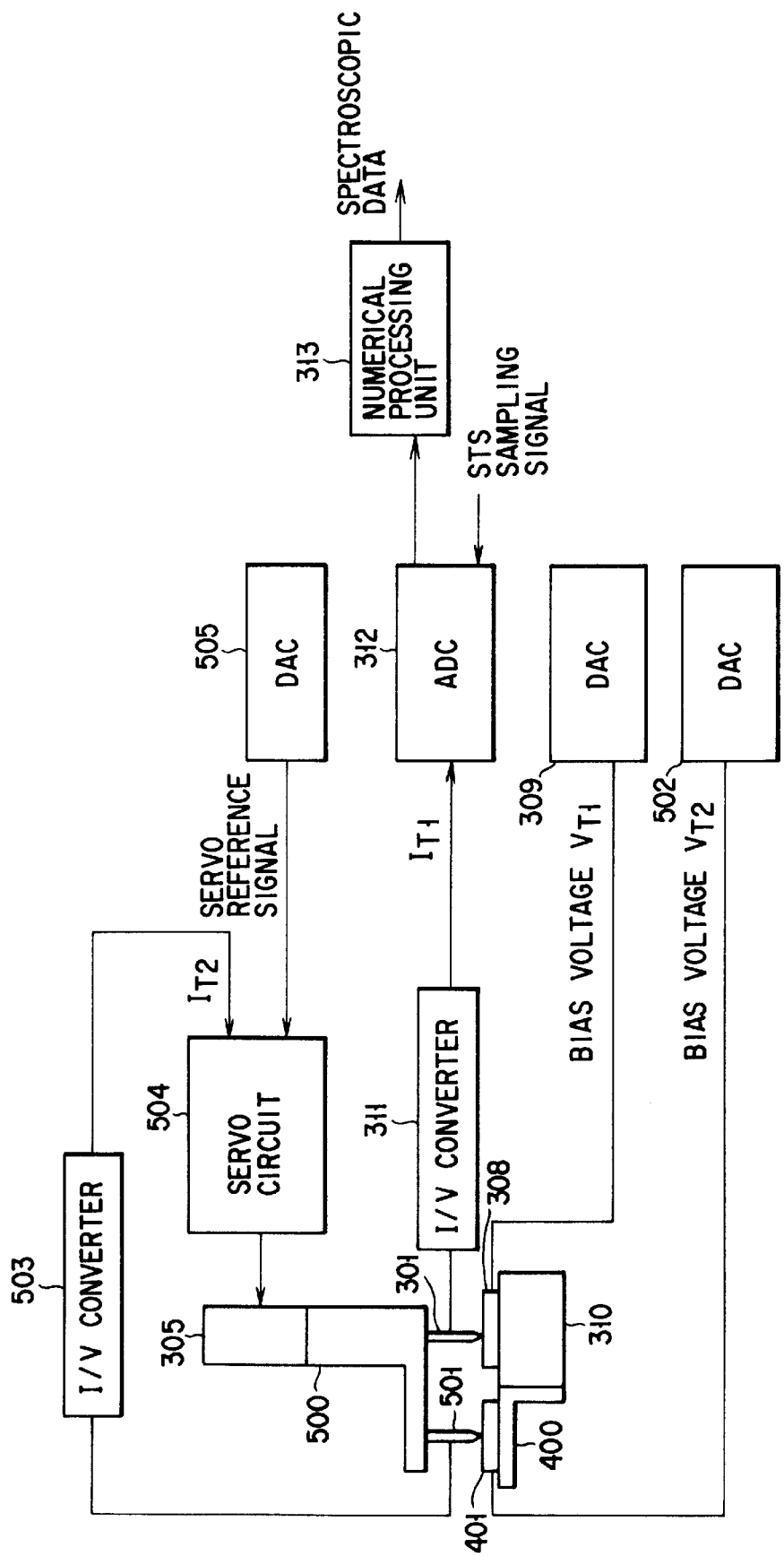
F I G. 4

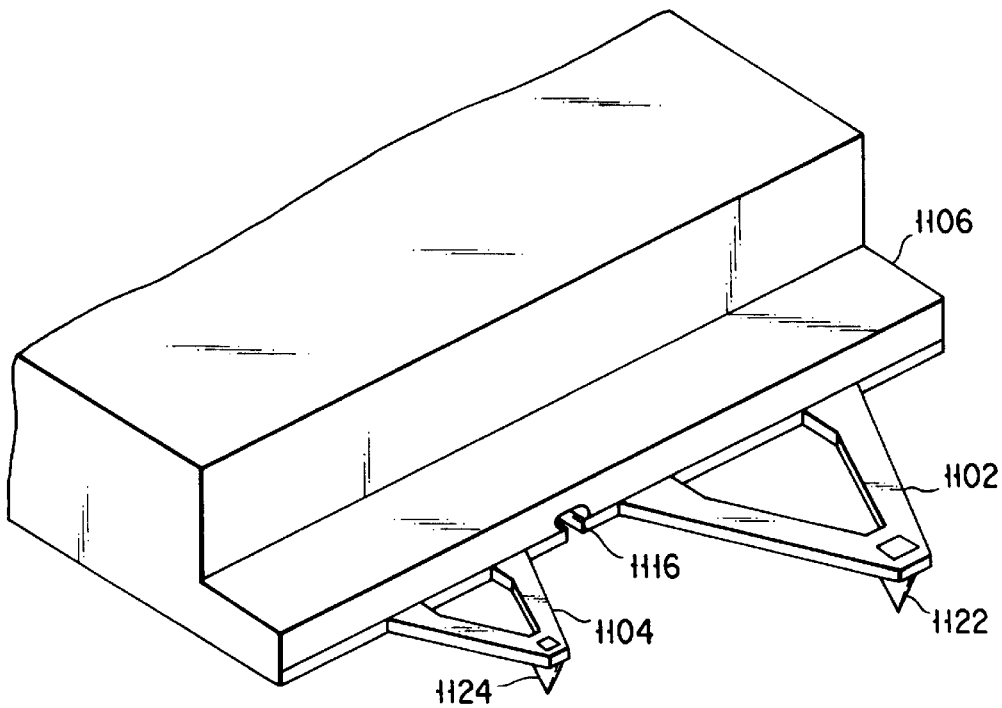
F I G. 5
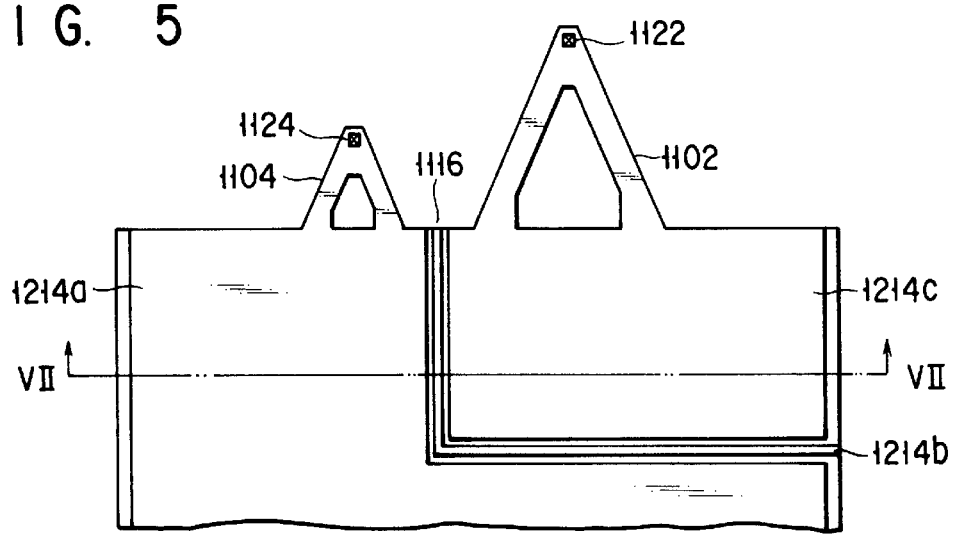
F I G. 6
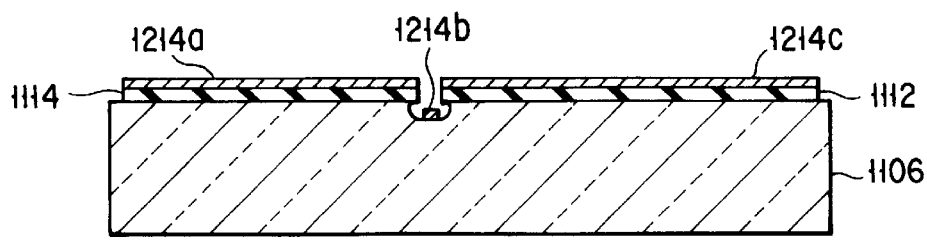
F I G. 7

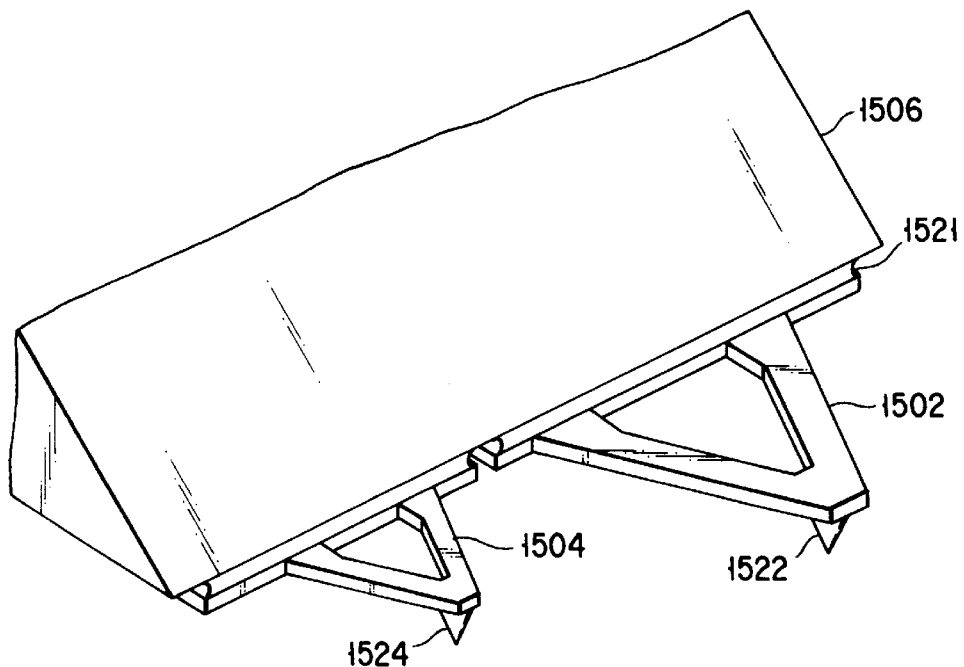
F I G. 11
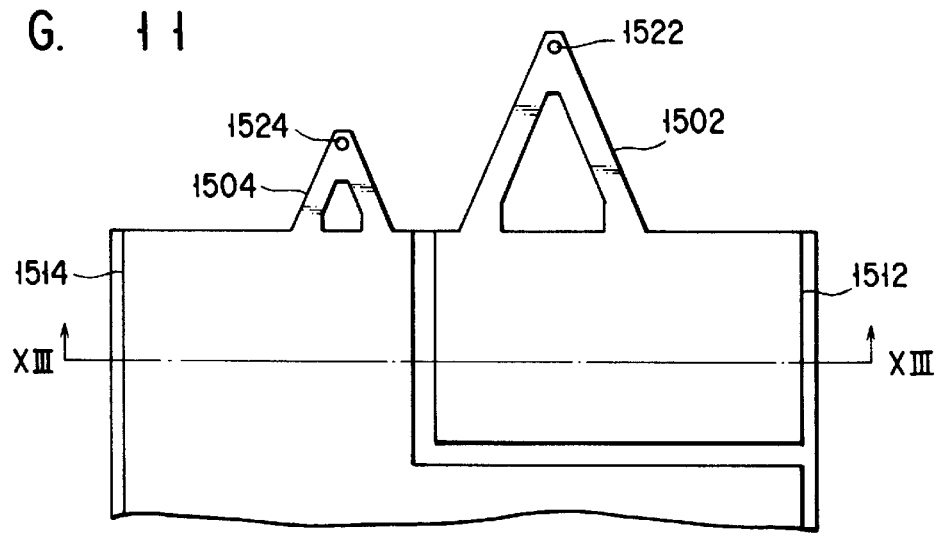
F I G. 12
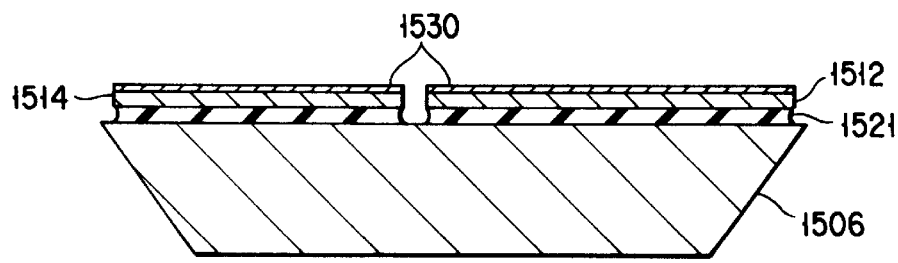
F I G. 13

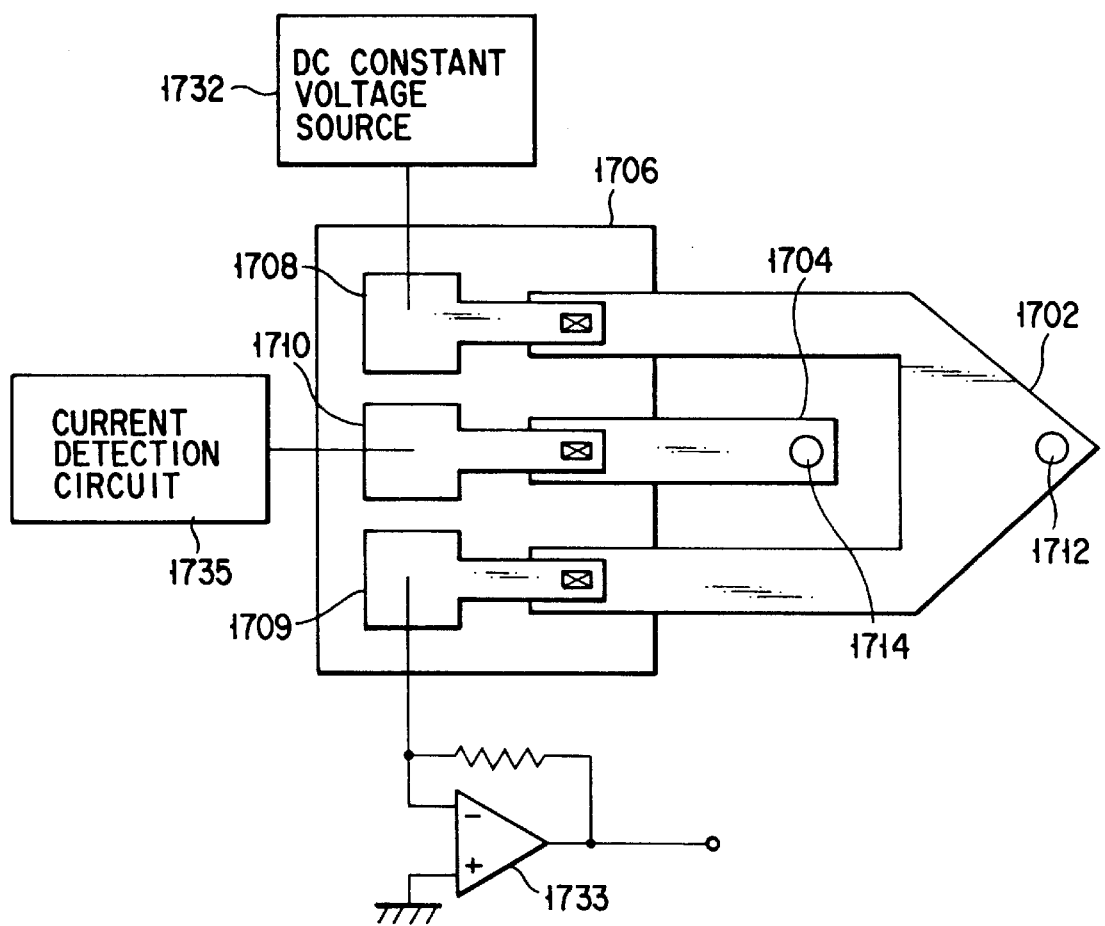
F I G. 18

SCANNING PROBE MICROSCOPE FOR MEASURING THE ELECTRICAL PROPERTIES OF THE SURFACE OF AN ELECTRICALLY CONDUCTIVE SAMPLE

BACKGROUND OF THE INVENTION

1. Field of the Invention

The present invention relates to scanning probe microscopes represented by a scanning tunneling microscope (STM), atomic force microscope (AFM), etc., and more specifically, to a scanning probe microscope, such as a scanning tunneling spectroscopic microscope or scanning tunneling potentiometric microscopes for measuring the electrical properties of the surface of a sample.

2. Description of the Related Art

One of scanning probe microscopes (SPMs) is proposed in U.S. Pat. No. Re. 33,387 entitled "Atomic Force Microscope and Method for Imaging Surfaces with Atomic Resolution." The SPMs have high resolutions on the atomic size level with respect to the vertical and horizontal directions despite their simple construction, and are represented by a scanning tunneling microscope (STM), atomic force microscope (AFM), etc.

Since the AFM was devised by G. Binnig et al., the inventors of the STM, (see "Physical Review Letters" vol. 56, p 930, 1986), it has been expected as novel surface configuration observing means for insulating materials and further investigated. The AFM has a probe, which is supported by means of a flexible cantilever. As the probe is brought close to the surface of a sample, a Van der Waals force first acts between the distal end of the probe and the sample surface. When the distance between the probe and the sample surface approaches the atomic distance, a repulsion force based on the Pauli exclusion principle then acts. The cantilever is displaced depending on the magnitude of an atomic force the distal end of the probe receives. Thus, an image of indentations of the sample surface can be obtained by scanning the sample surface with the probe and detecting the displacement of the cantilever between various points.

The STM moves the probe for scanning while keeping a tunneling current flowing between the probe and the sample constant by applying a bias voltage between the two, and obtains a servo signal for controlling the distance between the probe and the sample. The servo signal contains STM information, that is, reflects indentation information for the sample surface. Thus, an STM image with resolutions on the atomic size level can be obtained by plotting the STM information corresponding to the coordinates of measuring points.

The tunneling current reflects the distance between the probe and the sample, local state of electrons on the sample, and local potential of the sample. Accordingly, a normal STM image contains indentation information indicative of the microscopic roughness of the sample surface and information for the local potential distribution on the sample surface.

Recently, there have been developed scanning tunneling spectroscopy (STS) and scanning tunneling potentiometry (STP). In the STS, the indentation information and electronic property information for the sample surface are separated from the tunneling current, whereby information for the state of electrons on the surface are extracted. In the STP, the information for the potential distribution on the sample surface is extracted from the tunneling current.

Current imaging tunneling spectroscopy (CITS) is a representative of digital STS. In the CITS, the local density distribution of electrons on the sample surface is measured in accordance with the dependence of the tunneling current on the bias voltage. The CITS is based on the fact that the differential conductance is proportional to the local electron density in the case where the tunneling gap (distance between sample and probe) and barrier height are fixed without regard to the location. Thus, in the CITS, local current and voltage values are obtained as the probe is moved for scanning, they are stored in advance for each measuring point, and the differential conductance is obtained later by numerical computation.

The STS and STP measurements are carried out by using a probe for STM measurement on the assumption that the distance between the probe and the sample is fixed. The probe is relatively moved for XY-scanning over the surface of the sample in parallel relation throughout a measuring region of the surface. In the scanning operation, the probe is temporarily stopped at each of a large number of measuring points that are previously suitably arranged on a scanning line, and the electrical properties of the sample surface at each measuring point are measured by means of the probe. The measurement of the electrical properties at each measuring point is made in a manner such that the distance between the probe and the sample is fixed at a predetermined value. More specifically, the distance between the probe and the sample is adjusted and fixed to a length equivalent to a predetermined value of the tunneling current flowing through the probe. Then, the electrical properties of the sample surface at each measuring point is determined by examining the value of the tunneling current flowing through the probe while changing the voltage applied between the probe and the sample.

While a piezoelectric scanner is used to control the distance between the probe and the sample, it tends to undergo creeping or drift.

For these reasons, the distance between the probe and the sample cannot be kept fixed during the STS or STP measurement.

SUMMARY OF THE INVENTION

An object of the present invention is to provide a scanning microscope, such as a scanning tunneling spectroscopic microscope or scanning tunneling potentiometric microscope, for measuring the electrical properties of the surface of a sample with the distance between the probe and the sample fixed.

Another object of the invention is to provide a cantilever chip adapted for use in the scanning probe microscope described above.

Additional objects and advantages of the invention will be set forth in the description which follows, and in part will be obvious from the descriptions or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 schematically shows a scanning tunneling spectroscopic microscope according to a preferred embodiment of the present invention;

FIG. 4 schematically shows a scanning tunneling spectroscopic microscope according to another preferred embodiment of the invention;

FIG. 5 is a perspective view of a cantilever chip particularly applicable to the apparatus of FIG. 1;

FIG. 6 is a bottom view of the cantilever chip of FIG. 5;

FIG. 7 is a sectional view of the cantilever chip taken along line VII—VII of FIG. 6;

FIG. 11 is a perspective view of still another cantilever chip particularly applicable to the apparatus of FIG. 1;

FIG. 12 is a bottom view of the cantilever chip of FIG. 11;

FIG. 13 is a sectional view of the cantilever chip taken along line XIII—XIII of FIG. 12;

FIG. 18 is a bottom view showing the cantilever chip of FIG. 17 along with peripheral circuits.

DETAILED DESCRIPTION OF THE PREFERRED EMBODIMENTS

Figure 2:
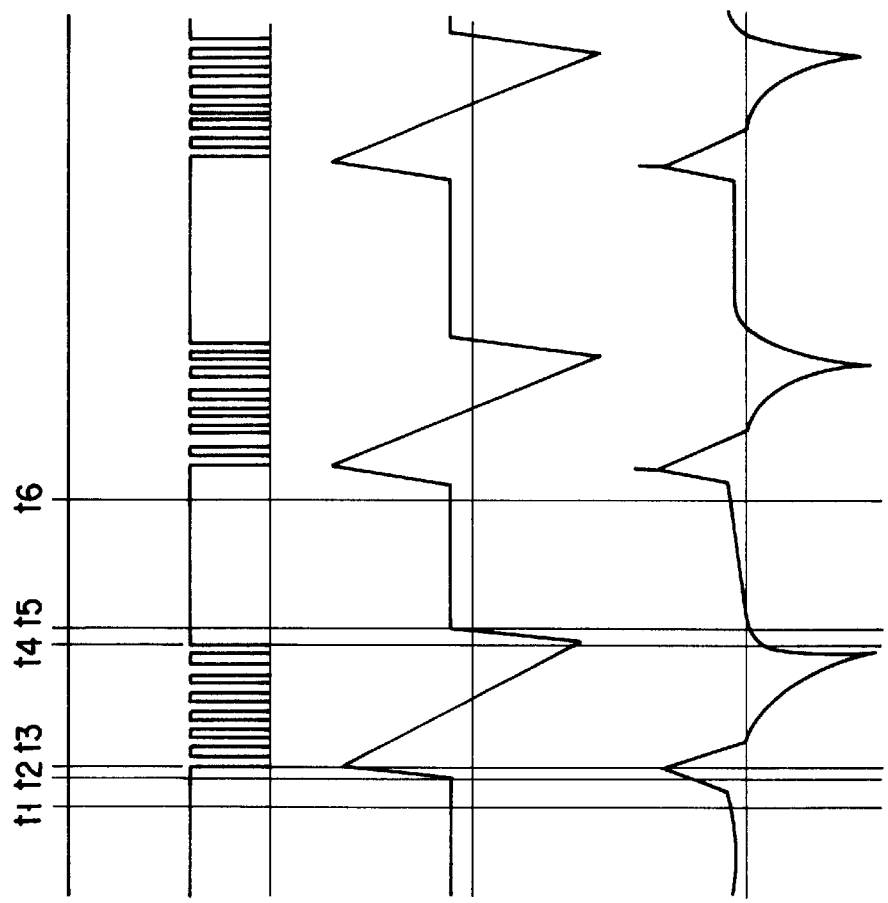
FIG. 2 is a timing chart for the measuring operation of the spectroscopic microscope shown in FIG. 1.

FIG. 1 schematically shows a scanning tunneling spectroscopic microscope according to a preferred embodiment of the present invention. As shown in FIG. 1, a metallic probe 301 is held by a holder 300. A cantilever 302 is one-sidedly supported on the holder 300 so that a probe 303 on its distal end is situated below the metallic probe 301. The cantilever 302 is preferably formed of a thin plate with a material that is as light in weight and high in elasticity as possible so that a substantial displacement can be obtained for an infinitesimal force, such as an atomic force. A Z-displacement sensor 304 optically detects a Z-direction displacement of the cantilever 302, and outputs an electrical signal (cantilever displacement signal $\Delta Z$) corresponding to the displacement. A piezoelectric device 305 supports the holder 300 for movement in the Z-direction.

A sample 308 is located under the metallic probe 301 and the cantilever 302, and can be moved for position adjustment and XY-scanning in the X- and Y-directions by means of an XY-stage 310 that carries the sample thereon. A DAC (digital-to-analog converter) 309 outputs a tunneling bias voltage $V_T$, which is supplied to an electrode (not shown) attached to the sample 308.

An I/V converter 311 converts a tunneling current flowing through the metallic probe 301, and outputs it as a tunneling current signal $I_T$. An ADC (analog-to-digital converter) 312 subjects the tunneling current signal $I_T$ to A/D conversion when it is supplied with an STS sampling signal. A numerical processing unit 313 processes tunneling current data, the output of the ADC 312, and computes spectroscopic data.

An ADC 604 subjects the cantilever displacement signal $\Delta Z$ from the Z-displacement sensor 304 to A/D conversion, and outputs cantilever displacement data as conversion data. A memory circuit 605 temporarily stores the cantilever displacement data delivered from the ADC 604. A DAC 601 subjects the cantilever displacement data stored in the memory circuit 605 to D/A conversion, and outputs a signal that is indicative of the displacement state of the cantilever 302 established when a desired distance is kept between the metallic probe 301 and the sample 308, that is, a servo reference signal $S_2$ as a target value of the cantilever displacement signal $\Delta Z$. A DAC 602 outputs a signal that is indicative of the tunneling current signal $I_T$ obtained when the desired distance is kept between the metallic probe 301 and the sample 308, that is, a servo reference signal $S_1$ as a target value of the tunneling current signal $I_T$.

A switch circuit 600 supplies a servo circuit 306 selectively with the tunneling current signal $I_T$ from the I/V converter 311 or the cantilever displacement signal $\Delta Z$ from the Z-displacement sensor 304. A switch circuit 603 supplies the servo circuit 306 selectively with the servo reference signal $S_2$ from the DAC 601 or the servo reference signal $S_1$ from the DAC 602.

The servo circuit 306 subjects the piezoelectric device 305 to feedback control such that the tunneling current signal $I_T$ supplied thereto through the switch circuit 600 is coincident with the servo reference signal $S_1$ supplied through the switch circuit 603 or that the cantilever displacement signal $\Delta Z$ supplied through the circuit 600 is coincident with the servo reference signal $S_2$ supplied through the circuit 603.

An STS measurement is made by means of the scanning tunneling spectroscopic microscope in the following manner. First, a region of the sample 308 to be measured is aligned with an XY-scanning range of the XY-stage 310. The measurement is carried out successively for all of a large number of measuring points on a predetermined scanning line. The following is a description of measuring operation at one of the measuring points.

The sample 308 is moved by the XY-stage 310 so that the measuring point is situated right under the metallic probe 301. In response to a servo switching signal, the switch circuits 600 and 603 are set at B, whereupon the tunneling current signal $I_T$ and the servo reference signal $S_1$ delivered from the I/V converter 311 and the DAC 602, respectively, are selected.

The DAC 309 outputs a constant bias voltage $V_T$, which is applied to the sample 308. The tunneling current flowing through the metallic probe 301 is converted into the tunneling current signal $I_T$ by the I/V converter 311, and is supplied to the servo circuit 306 through the switch circuit 600. At the same time, the DAC 602 outputs the servo reference signal $S_1$, the target value of the signal $I_T$, which is supplied to the servo circuit 306 through the switch circuit 603. The servo circuit 306 regulates the voltage applied to the piezoelectric device 305 so that the tunneling current signal $I_T$ delivered from the I/V converter 311 is coincident with the servo reference signal $S_1$. Thereupon, the holder 300 is brought close to the sample 308 so that the signal $I_T$ is equivalent to the target value. In this manner, the distance between the metallic probe 301 and the sample 308 is adjusted to the desired one.

When the desired distance is kept between the metallic probe 301 and the sample 308, the cantilever 302 is displaced by the contact between the probe 303 and the sample 308. The Z-displacement sensor 304 detects the displacement of the cantilever 302, and delivers the cantilever displacement signal $\Delta Z$, indicative of the cantilever displacement, to the ADC 604. The ADC 604 subjects the displacement signal $\Delta Z$ to A/D conversion, and delivers the cantilever displacement data, as its conversion data, to the memory circuit 605. The circuit 605 temporarily stores the cantilever displacement data, and delivers the data to the DAC 601. The DAC 601 subjects the cantilever displacement data delivered from the memory circuit 605 to D/A conversion, and delivers its conversion signal to the switch circuit 603. The conversion signal delivered from the DAC 601 represents the displacement of the cantilever 302 made when the desired distance is kept between the metallic probe 301 and the sample 308, and forms the servo reference signal $S_2$ as the target value for servo control based on the cantilever displacement signal $\Delta Z$, which will be described below.

Then, in response to the servo switching signal, the switch circuits 600 and 603 are set at A, whereupon the cantilever displacement signal $\Delta Z$ and the servo reference signal $S_2$ delivered from the Z-displacement sensor 304 and the DAC 601, respectively, are selected. As a result, the signal $\Delta Z$ from the sensor 304 and the signal $S_2$ from the DAC 601 are supplied to the servo circuit 306. The circuit 306 controls the voltage applied to the piezoelectric device 305 so that the cantilever displacement signal $\Delta Z$ delivered from the Z-displacement sensor 304 is always coincident with the serve reference signal $S_2$. This control is continued at least during subsequent tunneling current sampling, and the desired distance between the metallic probe 301 and the sample 308 is maintained as long as the control is continued.

Subsequently, the DAC 309 outputs the bias voltage $V_T$ that varies at a fixed gradient, and this voltage is applied to the sample 308. As this is done, the ADC 312 samples the tunneling current signal $I_T$ delivered from the I/V converter 311 in accordance with the STS sampling signal supplied thereto, converts the sampled signal into the tunneling current data, and delivers it to the numerical processing unit 313. The processing unit 313 obtains the spectroscopic data by processing the tunneling current data supplied thereto.

FIG. 2 is a timing chart for the measuring operation described above. By time $t_1$, the metallic probe 301 and the sample 308 are relatively moved for scanning, and the probe 301 is located on the measuring point. The switches 600 and 603 are shifted to B at time $t_1$. The distance between the metallic probe 301 and the sample 308 is adjusted to the desired value by time $t_2$. At time $t_2$, the switches 600 and 603 are shifted to A, and control of the distance between the probe 301 and the sample 308 based on the displacement of the cantilever 302 is started. This control is continued until time $t_5$. The bias voltage $V_T$ is varied during the period between times $t_2$ and $t_5$. During the period between times $t_3$ and $t_4$ in which the bias voltage $V_T$ decreases at a fixed gradient, the STS sampling signal is supplied, and the tunneling current signal is sampled. The bias voltage $V_T$ is restored to a fixed value at time $t_5$, whereupon the STS measurement at this measuring point ends. At time $t_5$, the control of the distance between the metallic probe 301 and the sample 308, based on the displacement of the cantilever 302, is suspended, the probe 301 is kept apart from the sample 308, and the probe 301 and the sample 308 are relatively moved for scanning. The probe 301 is located on the next measuring point by time $t_6$.

The desired distance between the metallic probe 301 and the sample 308 is settled depending on the tunneling current flowing through the probe 301, and is kept constant by means of an AFM sensor (cantilever 302 and Z-displacement sensor 304). Accordingly, this arrangement is effective even in the case where the accurate relative positions of the metallic probe 301 and the probe 303 on the cantilever 302 in the Z-direction are indistinct.

Figure 3:
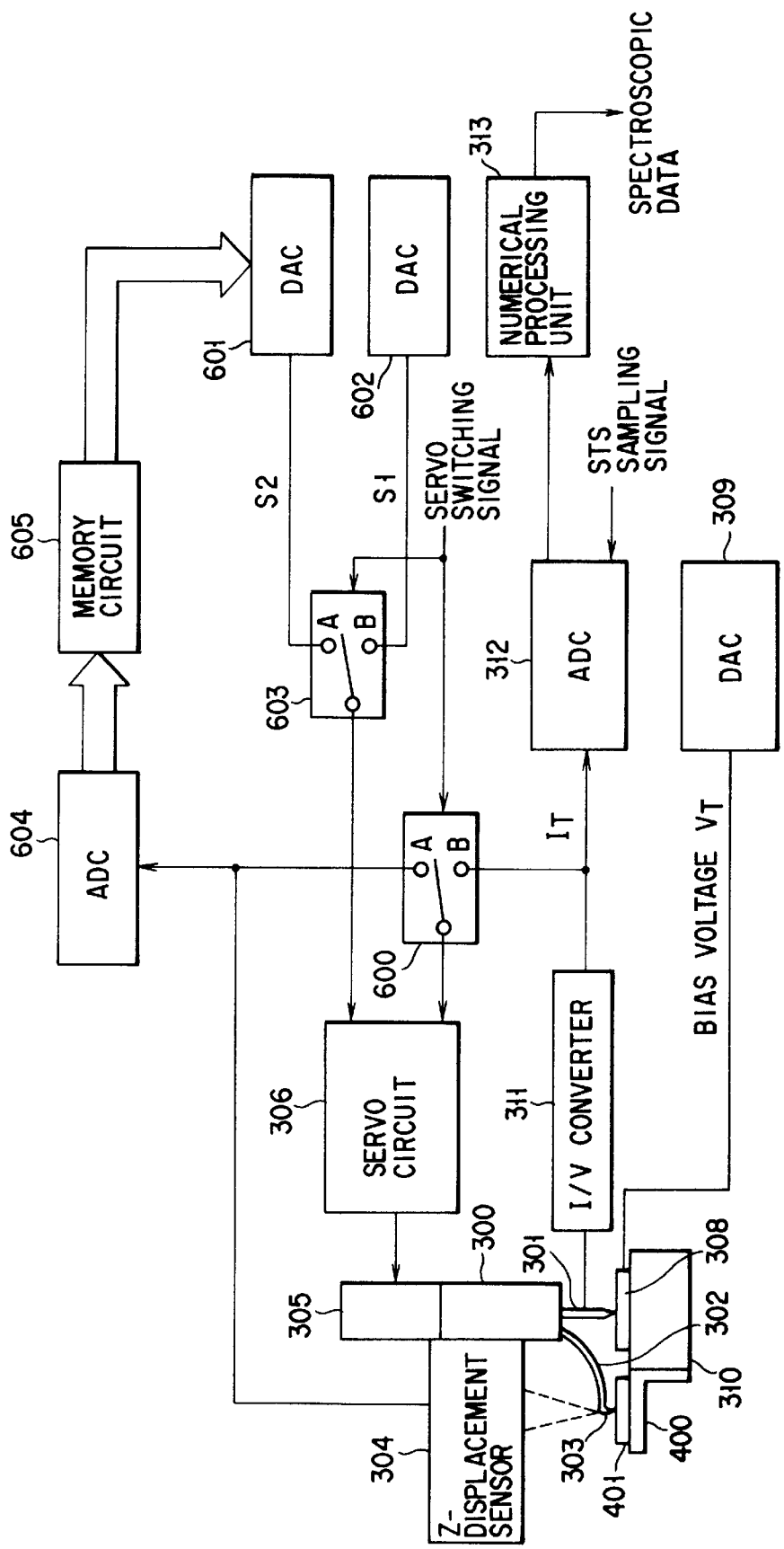
FIG. 3 shows a scanning tunneling spectroscopic microscope according to a modification of the apparatus of FIG. 1.

FIG. 3 shows a scanning tunneling spectroscopic microscope according to a modification of the present embodiment. Like reference numerals are used to designate like members in FIGS. 1 and 3, and a detailed description of those members is omitted.

A sample stage 400 is attached to the XY-stage 310, and a dummy sample 401 is placed on the stage 400. The cantilever 302 is displaced by the contact between the probe 303 on its distal end and the dummy sample 401 on the sample stage 400, not the sample 308 for STS measurement.

Except for those details, the apparatus according to this modification is arranged in quite the same manner as the one shown in FIG. 1, and the measurement is carried out in like manner.

FIG. 4 schematically shows an arrangement of a scanning tunneling spectroscopic microscope according to another preferred embodiment of the present invention. Like reference numerals are used to designate like members in FIGS. 1 and 4, and a detailed description of those members is omitted.

A sample stage 400 is attached to an XY-stage 310, and a dummy sample 401, formed of an electrical conductor, is placed on the stage 400. A DAC 502 outputs a constant tunneling bias voltage $V_{T2}$, which is supplied to an electrode (not shown) attached to the dummy sample 401.

Both of metallic probes 301 and 501 are held by means of a holder 500. The probes 301 and 501 are located over a sample 308 to be measured and the dummy sample 401, respectively. An I/V converter 503 converts a tunneling current flowing through the metallic probe 501 by applying the tunneling bias voltage $V_{T2}$ to the dummy sample 401, and outputs it as a tunneling current signal $I_{T2}$.

A servo circuit 504 subjects a piezoelectric device 305 to feedback control such that the tunneling current signal $I_{T2}$, the output of the I/V converter 503, has a desired value, that is, the distance between the metallic probe 301 and the sample 308 is a desired one. A DAC 505 supplies the servo circuit 504 with a servo reference signal that indicates a target value of the tunneling current signal $I_{T2}$, the output of the I/V converter 503.

An STS measurement is made by means of the scanning tunneling spectroscopic microscope in the following manner. First, a region of the sample 308 to be measured is aligned with an XY-scanning range of the XY-stage 310. The measurement is carried out successively for all of a large number of measuring points on a predetermined scanning line. The following is a description of measuring operation at one of the measuring points.

First, the sample 308 is moved by the XY-stage 310 so that the measuring point is situated right under the metallic probe 301. The DAC 502 outputs the constant tunneling bias voltage $V_{T2}$, which is applied to the dummy sample 401. The tunneling current flowing through the metallic probe 501 is converted into the tunneling current signal $I_{T2}$ by the I/V converter 503, and is supplied to the servo circuit 504.

Then, the DAC 505 outputs the servo reference signal that indicates the predetermined target value of the tunneling current signal $I_{T2}$, which is applied to the input of the servo circuit 504. The circuit 504 regulates the voltage applied to the piezoelectric device 305 so that the tunneling current signal $I_{T2}$ is coincident with the servo reference signal. Thereupon, the distance between the metallic probe 301 and the sample 308 is adjusted to the desired one. This control is continued at least during subsequent tunneling current sampling, and the desired distance between the metallic probe 301 and the sample 308 is maintained as long as the control is continued.

Subsequently, a DAC 309 outputs a bias voltage $V_T$ that varies at a fixed gradient, and this voltage is applied to the sample 308. As this is done, an ADC 312 samples a tunneling current signal $I_{T1}$ delivered from an I/V converter 311 in accordance with an STS sampling signal supplied thereto, converts the sampled signal into tunneling current data, and delivers it to a numerical processing unit 313. The processing unit 313 obtains spectroscopic data by processing the tunneling current data supplied thereto.

Since the desired distance between the metallic probe 301 and the sample 308 is settled by means of an STM sensor (probe 501, I/V converter 503, and DAC 502), this arrangement is effective only in the case where the accurate relative positions of the metallic probes 301 and 501 are evident.

Although the AFM or STM sensor is used to detect the distance between the metallic probe 301 and the sample 308 according to the embodiments described above, it may be replaced with some other sensor, such as a capacity sensor.

Although the present invention is applied to the scanning tunneling spectroscopic microscope (STS) according to the foregoing embodiments, it may be also applied to scanning tunneling potentiometry (STP). Technology for the STP is described, for example, in U.S. Pat. No. 5,185,572 entitled "Scanning Tunneling Potentio-Spectroscopic Microscope and Data Detecting Method", which discloses an apparatus capable of STM, STS, and STP measurements. The description of this technology is incorporated herein.

The following is a description of a cantilever chip applicable to the apparatuses according to the foregoing embodiments, especially the apparatus shown in FIG. 1. FIGS. 5 to 7 show a preferred example of the cantilever chip.

As shown in FIGS. 5 and 6, the cantilever chip includes two cantilevers 1102 and 1104, which extend side by side from an end of a glass support section 1106. These two cantilevers 1102 and 1104 are formed of a silicon nitride film each, and have probes 1122 and 1124 on their respective free ends. The opposite surfaces of each cantilever are coated individually with gold films 1212 and 1214 (see FIG. 8D). The two cantilevers 1102 and 1104 are different in size, having lengths of 200 µm and 100 µm, respectively, for example.

As shown in FIG. 6, the cantilevers 1102 and 1104 are separated from each other by a groove 1116 that is formed in the support section 1106. As shown in FIG. 7, therefore, the gold film 1214 formed on the probe side is divided between three gold films 1214a, 1214b and 1214c on a silicon nitride film 1114, in the groove 1116, and on a silicon nitride film 1112, respectively. Thus, the cantilevers 1102 and 1104 and therefore, the probes 1122 and 1124, are insulated electrically from one another.

Figure 8A:
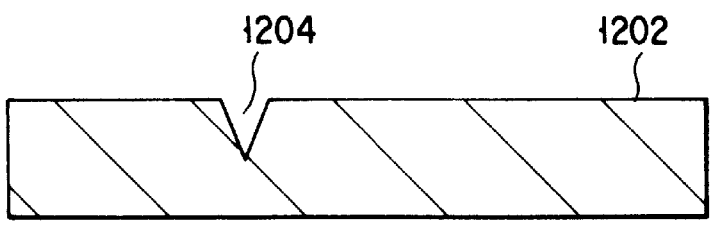
FIGS. 8A to 8D show a manufacturing process for the cantilever chip shown in FIGS. 5 to 7.
Figure 8B:
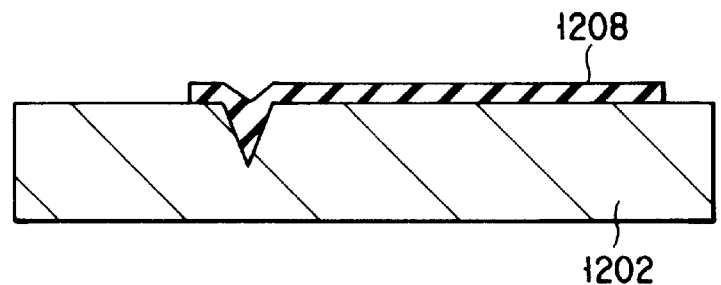

FIGS. 8A to 8D show manufacturing process for the cantilever chip shown in FIGS. 5 to 7. A silicon wafer 1202 is prepared, and it is formed with a hole 1204 for the formation of a probe by, for example, dry etching (FIG. 8A). Then, a silicon nitride film (0.4 to 1 µm thick) is formed by CVD on that surface of the wafer 1202 which has the hole 1204 therein, and the formed film is patterned by photolithography and dry etching (FIG. 8B). The patterned silicon nitride film 1208 has a shape corresponding to the cantilevers 1102 and 1104 shown in FIG. 6, and that portion of the film 1208 which corresponds to the L-shaped groove 1116 is removed.

Figure 8C:
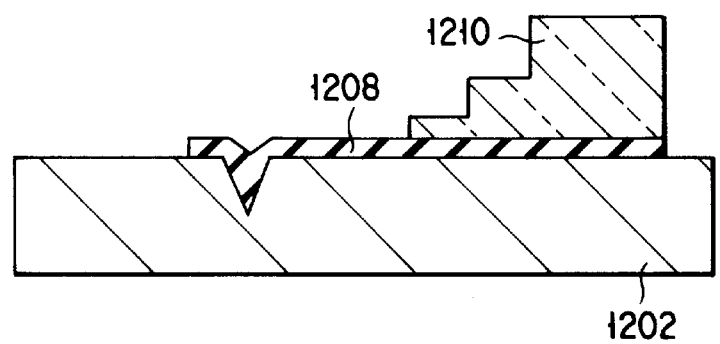

A Pyrex block 1210, which is worked in conformity with the pattern shape, is anodically bonded to the patterned silicon nitride film 1208 (FIG. 8C). The resulting structure is etched in a 40% aqueous solution of KOH, and dust and silicon oxide films adhering to the cantilevers are then removed by means of hydrofluoric acid. As this is done, an L-shaped portion of the glass support section 1106 on which the silicon nitride film 1208 is removed is etched, whereupon the groove 1116 shown in FIGS. 5 to 7 is formed.

Figure 8D:
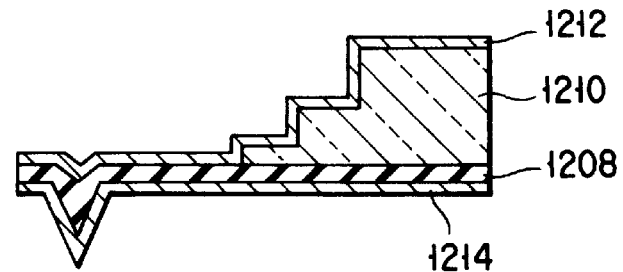

Finally, the gold films 1212 and 1214 are formed individually on the opposite surfaces of each cantilever (FIG. 8D). In order to enhance the adhesion of the films 1212 and 1214 to the cantilevers, chromium and gold may, for example, be deposited on the cantilevers before the gold films are formed.

The cantilever chip of silicon nitride and Pyrex shown in FIGS. 5 to 7 is manufactured in the process described above.

The shorter cantilever 1104 of the cantilever chip is used for the STS or STP measurement, and the longer cantilever 1102 for AFM sensor operation. More specifically, an electrode is connected to the gold film 1214a on the silicon nitride film 1114, a bias voltage is applied between the probe 1124 on the cantilever 1104 and the sample surface, and the electrical properties of the sample surface are detected by means of the probe 1124. The cantilever chip is supported obliquely. While the shorter cantilever 1104 is being used to detect the electrical properties of the sample surface, therefore, the probe 1122 on the longer cantilever 1102 is naturally in contact with the sample surface, so that the cantilever 1102 is displaced. This displacement is optically detected by means of reflected light from laser light applied to the gold film 1212 on the back of the cantilever 1102, and the vertical position of the cantilever chip with respect to the sample is controlled so that the displacement is constant. By this control, as mentioned before, the distance between the distal end of the probe 1124 and the sample surface is kept constant while the tunneling current for the STS or STP measurement is being sampled.

Since the probes 1122 and 1124 are isolated electrically from each other by the groove 1116, the bias voltage applied to the probe 1124 can never influence the probe 1122 that is engaged in the AFM sensor operation. In contrast with this, an electrical signal received from the sample surface by the probe 1122 can never be involved in an electrical signal detected by means of the probe 1124, that is, the tunneling current for the STS or STP measurement.

Thus, the cantilever chip is divided between the cantilever that has the probe for detecting the local electrical properties of the sample surface and the cantilever for keeping the distance between the probe and the sample surface constant. Accordingly, the distance between the probe and the sample surface can be set more accurately, so that the local electrical properties of the sample surface can be detected with higher accuracy.

Moreover, the cantilever chip is designed so that the longer cantilever with a smaller spring constant is used for the AFM sensor operation to control the distance between the probe and the sample surface, and the shorter cantilever with a larger spring constant is used to detect the electrical properties of the sample surface. Thus, the distance between the probe and the sample surface can be controlled with high sensitivity without damaging the sample surface.

Further, the cantilever chip can be easily manufactured with reliability by slightly changing the cantilever configuration of silicon nitride films manufactured by a conventional cantilever manufacturing method.

Besides, the cantilever chip includes an electrical conductor for the detection of the electrical properties. Since this conductor is formed of a gold coating that cannot be easily oxidized, it can detect the electrical properties with higher accuracy.

If the gold film of the cantilever for the AFM sensor operation is provided with an electrode such that the potential of the probe on the cantilever is equal to that of the sample, furthermore, an electrostatic force produced between the sample and the probe is canceled. Thus, the distance between the probe and the sample surface can be set more accurately, and the local electrical properties of the sample surface can be detected with accuracy.

Although the cantilevers of this cantilever chip are triangular in shape, they may alternatively be rectangular. Also, the cantilever chip may be designed so that the longer cantilever for the AFM sensor operation and the shorter cantilever for the detection of the electrical properties are rectangular and triangular, respectively.

Moreover, the two cantilevers may be arranged so that the one for the distance control is narrower and has a smaller spring constant (higher softness), and the other for the detection of the electrical properties is wider and has a larger spring constant (higher hardness).

Figure 9:
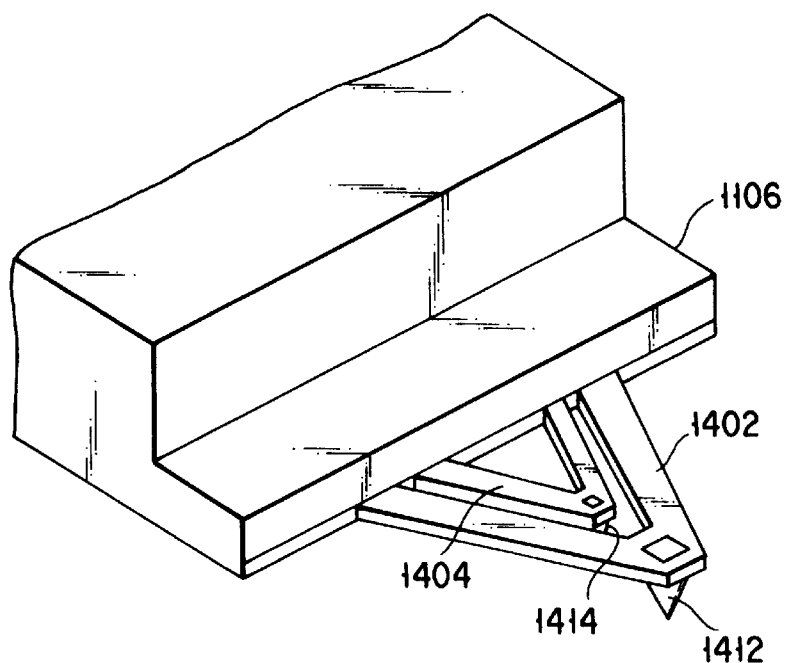
FIG. 9 is a perspective view of another cantilever chip particularly applicable to the apparatus of FIG. 1.
Figure 10:
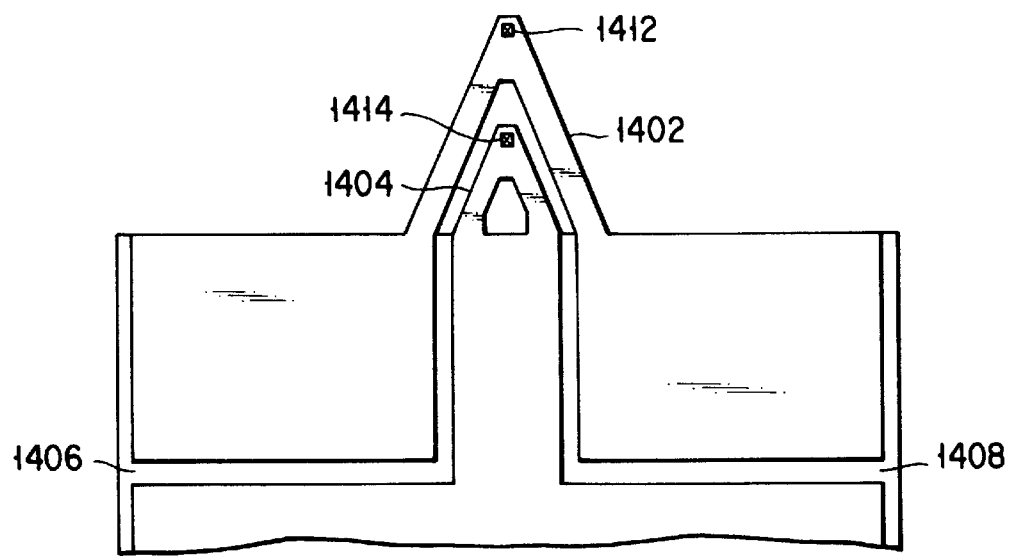
FIG. 10 is a bottom view of the cantilever chip of FIG. 9.

FIGS. 9 and 10 show another cantilever chip adapted for use in the apparatuses according to the foregoing embodiments, especially the apparatus shown in FIG. 1. This cantilever chip is manufactured substantially according to the manufacturing process for the foregoing cantilever chip. In this cantilever chip, as shown in FIGS. 9 and 10, a shorter cantilever 1404 is located in a hollow portion of a longer cantilever 1402. Probes 1412 and 1414 formed individually on the two cantilevers are insulated electrically from each other by two L-shaped grooves 1406 and 1408.

Preferably, the longer cantilever 1402 is used for the AFM sensor operation to control the distance between the probe 1414 on the shorter cantilever 1404 and the sample, while the probe 1414 is used to detect the electrical properties of the sample surface. Since the shorter cantilever 1404 is located in the longer cantilever 1402, the probes 1412 and 1414 for the distance control and the detection of the electrical properties are situated nearer to each other than in the structure (cantilever chip shown in FIGS. 5 to 7) that includes the cantilevers arranged in parallel with each other. Thus, the distance between the probe 1414 and the sample can be controlled more accurately.

Preferably, moreover, a straight line that connects the probes 1412 and 1414 is coincident with a longitudinal axis that passes through the respective centers of the cantilevers 1402 and 1404. This arrangement allows the probes 1412 and 1414 to be situated further closer to each other.

Preferably, furthermore, the distance between the probes 1412 and 1414 is restricted to hundreds of micrometers or less.

According to this cantilever chip, as compared with the foregoing one, therefore, the probes 1412 and 1414 can be situated nearer to each other, so that the distance between the probe and the sample surface can be set more accurately, and the electrical properties can be detected with accuracy.

FIGS. 11 to 13 show still another cantilever chip adapted for use in the apparatuses according to the foregoing embodiments, especially the apparatus shown in FIG. 1. This cantilever chip includes silicon plates 1512 and 1514 that have cantilevers 1502 and 1504, respectively. The plates 1512 and 1514 are fixed to a silicon support section 1506 by means of a silicon oxide film 1521. The cantilever 1502 is relatively long and has a probe 1522 on its free end. The cantilever 1504 is relatively short and has a probe 1524 on its free end. Each of the silicon plates 1512 and 1514 has an electrically conductive layer 1530 formed on its probeside electrode surface. The plates 1512 and 1514 are divided by an L-shaped groove, so that the probe 1522 and 1524 are insulated electrically from each other. The silicon plate 1514 that has the cantilever 1504 is formed extending to that portion (not shown) of the support section opposite to the cantilever.

Figure 14A:
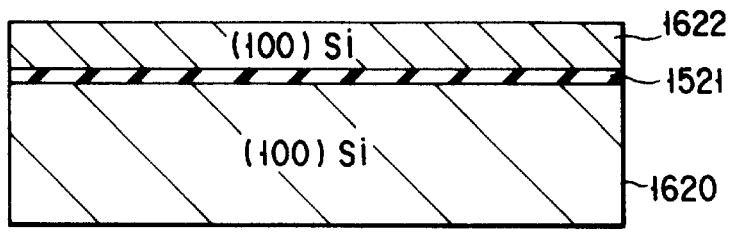
FIGS. 14A to 14E show a manufacturing process for the cantilever chip shown in FIGS. 11 to 13.
Figure 14B:
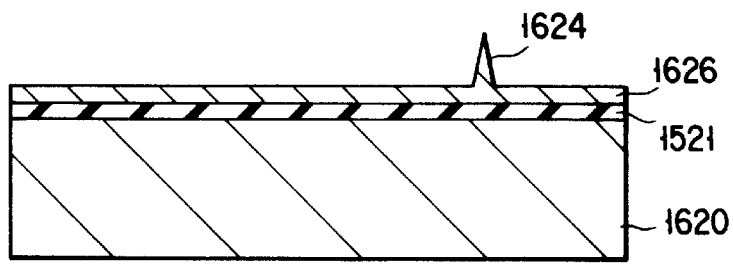
Figure 14C:
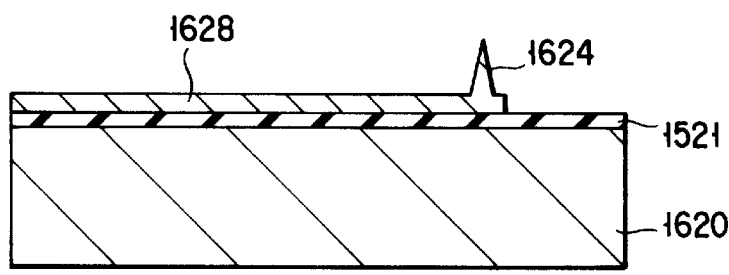

FIGS. 14A to 14D show manufacturing process for the cantilever chip shown in FIGS. 11 to 13. First, a so-called silicon-on-insulator (SOI) substrate is prepared as a starting substrate by first forming the intermediate silicon oxide film 1521 on one surface of a silicon substrate 1620 with a plane bearing of (100) and then sticking a silicon substrate 1622 as an active layer with the same plane bearing of (100) to the film 1521 (FIG. 14A). A probe 1624 is first formed on the active layer 1622 by a method combining photolithography and dry or wet etching (FIG. 14B). Thereafter, an active layer 1626 having the probe 1624 thereon is patterned by photolithography and etching (FIG. 14C). A patterned active layer 1628 includes the cantilevers 1502 and 1504 shown in FIG. 12.

Figure 14D:
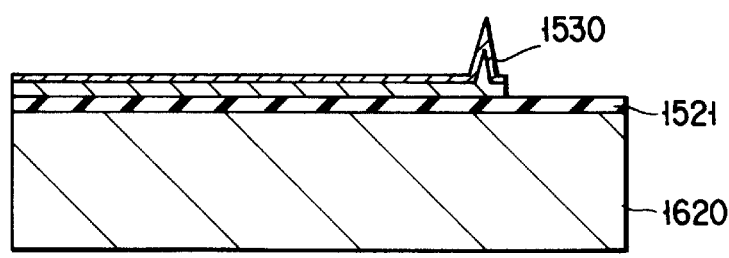
Figure 14E:
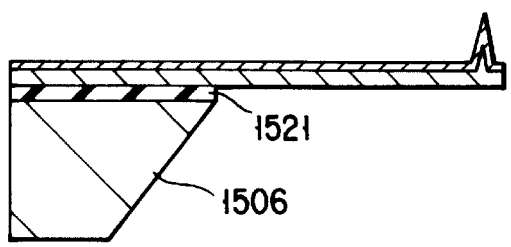

Then, the electrode surface of the patterned active layer 1628 is injected with boron (B) or the like by ion implantation, whereupon the electrically conductive layer 1530 is formed (FIG. 14D). Thereafter, a mask is formed on the whole area of the conductive layer 1530 except the region corresponding to the L-shaped groove shown in FIG. 12, and the groove is formed by etching the conductive layer 1530, active layer 1628, and silicon oxide film 1521. Subsequently, the support section 1506 is formed by subjecting the silicon substrate 1620 to wet anisotropic etching from the back side. Finally, the silicon oxide films around the cantilevers and dust adhering to the cantilevers during the process are removed by means of an aqueous solution of hydrofluoric acid or the like (FIG. 14E).

The silicon cantilever chip is manufactured according to the process described above.

The shorter cantilever 1504 of the cantilever chip is used for the STS or STP measurement, and the longer cantilever 1502 for the AFM sensor operation. More specifically, an electrode is connected to the conductive layer 1530 on the electrode surface of the silicon plate 1514, a bias voltage is applied between the probe 1524 on the cantilever 1504 and the sample surface, and the electrical properties of the sample surface are detected by means of the probe 1524. Since the cantilever chip is supported obliquely, the probe 1522 is naturally in contact with the sample surface, so that the longer cantilever 1502 is displaced. This displacement is optically detected by, for example, optical means, and the cantilever chip is vertically moved with respect to the sample so that the displacement is constant. By this control, the distance between the distal end of the probe 1524 and the sample surface is kept constant while the tunneling current for the STS or STP measurement is being sampled.

Since the probe 1522 for the AFM sensor operation and the probe 1524 for the detection of the electrical properties are insulated electrically from each other, the bias voltage applied to the probe 1524 can never influence the probe 1522 that is engaged in the AFM sensor operation, and an electrical signal received from the sample surface by the probe 1522 can never be involved in the electrical properties detected by means of the probe 1524.

Thus, the cantilever chip is divided between the cantilever that has the probe for detecting the local electrical properties of the sample surface and the cantilever for keeping the distance between the probe and the sample surface constant. Accordingly, the distance between the probe and the sample surface can be set more accurately, so that the local electrical properties of the sample surface can be detected with higher accuracy.

Moreover, the cantilever chip is designed so that the longer cantilever with a smaller spring constant is used for the AFM sensor operation to control the distance between the probe and the sample surface, and the shorter cantilever with a larger spring constant is used to detect the electrical properties of the sample surface. Thus, the distance between the probe and the sample surface can be controlled with high sensitivity without damaging the sample surface.

Since the conductive layer of the cantilever chip is formed by injection ions into silicon, moreover, the radius of curvature of the distal end of the probe cannot become larger than during the formation of the probe. Thus, more local electrical properties can be detected, and the distance between the probe and the sample surface can be set more accurately.

If the conductive layer of the cantilever for the AFM sensor operation is provided with an electrode such that the potential of the probe on the cantilever is equal to that of the sample, furthermore, an electrostatic force produced between the sample and the probe is canceled. Thus, the distance between the probe and the sample surface can be set more accurately, and the local electrical properties of the sample surface can be detected with accuracy.

In this cantilever chip, no reflective film is formed on that surface of each cantilever opposite to the probe. Alternatively, however, a reflective film of metal or the like may be formed by coating.

The silicon plates on the support section, having the cantilevers and conductive layer, like those of the aforementioned cantilever chip, may be shaped in the manner shown in FIG. 10.

In the aforesaid process, moreover, the ion injection for the formation of the conductive layer is carried out after the patterning for the cantilever configuration. Alternatively, the patterning for the cantilever configuration may be effected after the ion injection.

Further, the process for manufacturing the cantilever chip is not limited to the ones shown in FIGS. 14A to 14E.

Figure 15:
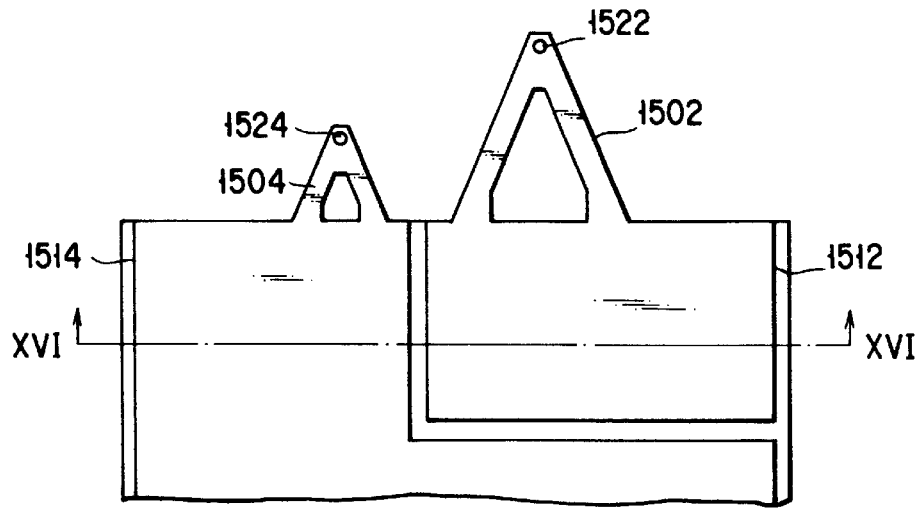
FIG. 15 is a bottom view of a further cantilever chip particularly applicable to the apparatus of FIG. 1.
Figure 16:
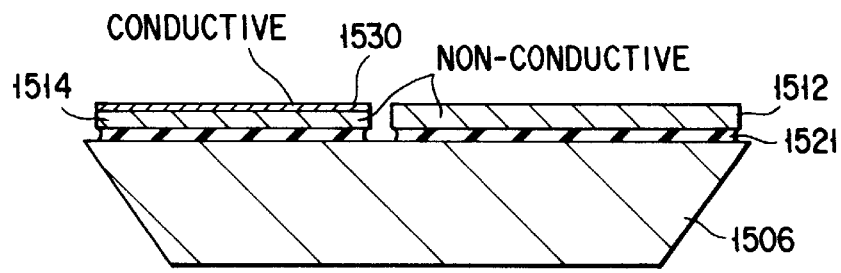
FIG. 16 is a sectional view of the cantilever chip taken along line XVI—XVI of FIG. 15.

FIGS. 15 and 16 show a further cantilever chip adapted for use in the apparatuses according to the foregoing embodiments, especially the apparatus shown in FIG. 1. This cantilever chip is manufactured substantially according to the manufacturing process for the directly foregoing cantilever chip (FIGS. 11 to 13). More specifically, the cantilever chip of this modification is manufactured in the same manner as the foregoing one except that a resist is formed by photolithography on a part of the active layer 1628 corresponding to the silicon plate 1512, including the longer cantilever 1502, before ion injection, and that boron ions or the like are injected with use of the formed resist as a mask.

As seen from FIG. 16, therefore, this cantilever chip is designed so that the silicon plate 1514 including the shorter cantilever 1504 is provided with the conductive layer 1530, and the silicon plate 1512 including the longer cantilever 1502 is not.

The longer cantilever 1502 is used for the AFM sensor operation to control the distance between the probe 1524 on the shorter cantilever 1504 and the sample, and the shorter cantilever 1504 is used for the detection of the electrical properties of the sample surface by means of the probe 1524 for the STS or STP measurement. Since the longer cantilever 1502, like the cantilever for the conventional AFM measurement, has no conductive layer, it can control the distance between the probe 1524 on the shorter cantilever 1504 and the sample under the same conditions for the AFM measurement.

Figure 17:
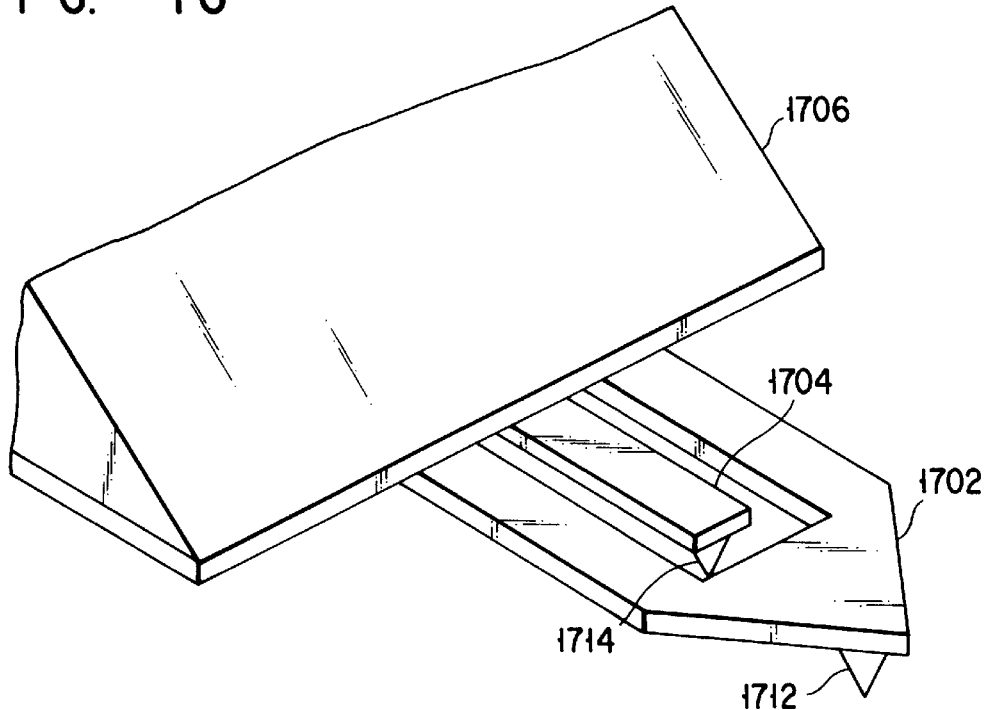
FIG. 17 is a perspective view of a cantilever chip with a displacement detecting function particularly applicable to the apparatus of FIG. 1 in place of a cantilever and a displacement sensor therefor.

FIGS. 17 and 18 show a cantilever chip with a displacement detecting function applicable to the apparatuses according to the foregoing embodiments in place of the cantilever and the displacement sensor therefor, e.g., the cantilever 302 and the Z-displacement sensor 304 of the apparatus of FIG. 1.

The cantilever chip includes a U-shaped cantilever 1702 with a sensor function that utilizes the distortion resistance effect and an elongated rectangular cantilever 1704 inside the cantilever 1702. The cantilever 1702 has a distortion resistance layer therein, which is connected to aluminum electrodes 1708 and 1709 on a support section 1706. The cantilever 1704 has an electrically conductive layer on its probeside electrode surface, and the conductive layer is connected to an aluminum electrode 1710 on the support section 1706. A DC constant voltage source 1732 is connected to the electrode 1708 of the cantilever 1702, while an operational amplifier 1733 for current measurement is connected to the electrode 1709. Also, a current detection circuit 1735 for the detection of the electrical properties of the sample is connected to the electrode 1710 of the cantilever 1704.

A DC voltage of several volts or below from the DC constant voltage source 1732 is applied between the electrodes 1708 and 1709 of the cantilever 1702, and the displacement of a probe 1712 on the cantilever 1702 is detected in accordance with a change in resistance of the distortion resistance layer corresponding to a displacement of the cantilever 1702 that is caused by an interactive force between the probe 1712 and the sample surface. The change of the resistance of the distortion resistance layer is detected as a change of a current signal by means of the operational amplifier 1733 for current measurement. In this manner, the cantilever 1702 is used to carry out the AFM sensor operation, thereby regulating the distance between the probe 1714 of the cantilever 1704 and the sample surface and detecting the electrical properties of the sample.

Since the cantilever chip can control the distance between the probe and the sample surface by utilizing the sensor function therein, it can detect the electrical properties of the sample without using any external sensor. Accordingly, the cantilever chip itself can be moved to each measuring point for scanning, so that the degree of freedom of the apparatus can be heightened.

Preferably, a straight line that connects the probes 1712 and 1714 is coincident with a longitudinal axis that passes through the respective centers of the cantilevers 1702 and 1704. This arrangement allows the probes 1712 and 1714 to be situated further closer to each other.

Preferably, furthermore the distance between the probes 1712 and 1714 is restricted to hundreds of micrometers or less.

According to this cantilever chip, therefore, the distance between the probe and the sample surface can be set more accurately, so that the electrical properties can be detected with high accuracy.

The distance between the probe and the sample may be detected by utilization of excitation-mode AFM measurement. In this measurement, the probe is scanned while oscillating, so that higher resolution is achieved.

It is known that the cantilevers, having different lengths and widths, oscillate with different amplitudes. These amplitudes increase in proportion to the lengths of the cantilevers, and decrease in proportion to the widths of the cantilevers. Accordingly, the longer cantilever is liable to oscillate with a wider amplitude than the shorter cantilever. If the amplitude of the longer cantilever is adjusted to a desired value, therefore, it is evident that the cantilever is applicable to the excitation-mode AFM measurement.

The amplitude of the cantilever for the excitation-mode AFM measurement is as narrow as about 50 nanometers. Thus, the shorter cantilever is supposed to oscillate with an amplitude further narrower than this, or depending on its lengths hardly to oscillate. It can be said, therefore, that the amplitude hardly has any influence on the detection of the electrical properties by means of the shorter cantilever.

For this reason, the distance between the probe on the cantilever and the sample can be set more accurately, so that the electrical properties can be detected with higher accuracy.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A scanning probe microscope for measuring electrical properties of a surface of an electrically conductive sample, comprising:

a first sensor, which includes an electrically conductive first probe located near the surface of the sample, for detecting electrical information concerning electrical properties of the sample surface, including the state of electrons on the sample surface and the electrical potential of the sample surface, and then outputting a first electrical signal corresponding to the detected information;

a second sensor for detecting the distance between the first probe and the sample, and then outputting a second electrical signal corresponding thereto;

moving means for relatively moving the first probe and the sample in a three-dimensional manner;

a servo controller for adjusting the distance between the first probe and the sample to a desired value by servo control in accordance with the second electrical signal delivered from the second sensor while the electrical information concerning electrical properties of the sample surface is being detected by the first sensor; and a processing unit for processing the first electrical signal delivered from the first sensor.

2. A scanning probe microscope according to claim 1, wherein said first sensor includes:

a bias voltage supply for applying a bias voltage between the first probe and the sample, and a current-to-voltage converter for converting a tunneling current flowing through the first probe into a voltage, and then outputting the voltage as the first electrical signal, the bias voltage supply changing the bias voltage applied between the first probe and the sample while the electrical information concerning electrical properties of the sample surface is being detected by the first sensor.

3. A scanning probe microscope according to claim 2, wherein said second sensor includes:

a second probe located in front of the sample surface, a cantilever having the second probe supported on a free end thereof so as to be displaceable depending on a force acting between the second probe and the sample, and a displacement sensor for sensing a displacement of the free end of the cantilever, and then outputting a signal corresponding to the sensed displacement as the second electrical signal.

4. A scanning probe microscope according to claim 3, wherein said servo controller includes:

a servo circuit for controlling the moving means so that a signal supplied thereto is coincident with a servo reference signal therefor, a first switch device for selectively supplying one of the first and second electrical signals to the servo circuit, first servo reference signal output means for outputting a first servo reference signal which is a target value that the first electrical signal should take to attain a desired distance between the first probe and the sample, second servo reference signal output means for outputting a second servo reference signal which is the second electrical signal produced when the first electrical signal is coincident with the first serve reference signal, and a second switch device for selectively supplying one of the first and second servo reference signals to the servo circuit, the second switch device being shifted in association with the first switch device, the first switch device being adapted to supply the servo circuit selectively with the second electrical signal, and the second switch device being adapted to supply the servo circuit selectively with the second servo reference signal, while the electrical information concerning electrical properties of the sample surface is being detected by the first sensor.

5. A scanning probe microscope according to claim 4, wherein said second servo reference signal output means includes a memory for storing the second electrical signal when the first electrical signal is coincident with the first servo reference signal, said second servo reference signal output means outputting the stored electrical signal as the second servo reference signal.

6. A scanning probe microscope according to claim 3, wherein:

said first and second sensors include a single cantilever chip, the single cantilever chip including a support section, a relatively short first cantilever extending from the support section, and a relatively long second cantilever extending from the support section, and wherein the first probe is supported on a free end of the first cantilever, and the second probe is supported on a free end of the second cantilever, the first and second probes being electrically insulated from each other.

7. A scanning probe microscope according to claim 6, wherein:
said first cantilever has a relatively small spring constant, and
said second cantilever has a relatively large spring constant.

8. A scanning probe microscope according to claim 6, wherein:
said first and second cantilevers substantially share a common longitudinal axis, and
a straight line connecting said first and second probes is substantially coincident with the common longitudinal axis.

9. A scanning probe microscope according to claim 8, wherein:
said second cantilever is U-shaped and includes a distortion resistance layer formed therein, the distortion resistance layer being arranged so as to undergo a change in resistance corresponding to a displacement of the free end of the second cantilever, and
said second sensor includes means for outputting a signal corresponding to the resistance of the distortion resistance layer, said second sensor outputting the signal as the second electrical signal.

10. A scanning probe microscope according to claim 9, wherein said means for outputting the signal corresponding to the resistance includes:
a DC constant voltage source connected electrically to one end of the distortion resistance layer, and
an operational amplifier connected electrically to another end of the distortion resistance layer.

11. A scanning probe microscope according to claim 2, which further comprises:
a dummy sample located near the sample to be measured, substantially on a same level with the sample to be measured, and
wherein said second sensor includes:
a second probe located in front of the surface of the dummy sample,
a cantilever having the second probe supported on a free end thereof so as to be displaceable depending on a force acting between the second probe and the dummy sample, and
a displacement sensor for sensing a displacement of the free end of the cantilever, and outputting a signal corresponding to the sensed displacement as the second electrical signal.

12. A scanning probe microscope according to claim 11, wherein said servo controller includes:
a servo circuit for controlling the moving means so that a signal supplied thereto is coincident with a servo reference signal therefor,
a first switch device for selectively supplying one of the first and second electrical signals to the servo circuit,
first servo reference signal output means for outputting a first servo reference signal for the first electrical signal,
second servo reference signal output means for outputting a second servo reference signal for the second electrical signal, and
a second switch device for selectively supplying one of the first and second servo reference signals to the servo circuit,
the second switch device being shifted in association with the first switch device, the first switch device being adapted to supply the servo circuit selectively with the second electrical signal, and the second switch device being adapted to supply the servo circuit selectively with the second servo reference signal, while the electrical information concerning electrical properties of the sample surface is being detected by the first sensor.

13. A scanning probe microscope according to claim 12, wherein said second servo reference signal output means includes a memory for storing the second electrical signal when the first electrical signal is coincident with the first servo reference signal, said second servo reference signal output means outputting the stored electrical signal as the second servo reference signal.

14. A scanning probe microscope according to claim 2, which further comprises:
an electrically conductive dummy sample located near the sample to be measured, substantially on a same level with the sample to be measured, and
wherein said second sensor includes:
a second electrically conductive probe located near the surface of the dummy sample,
second bias voltage applying means for applying a bias voltage between the second probe and the dummy sample, and
a current-to-voltage converter for converting a tunneling current flowing through the probe into a voltage, and then outputting the voltage as the second electrical signal.

15. A scanning probe microscope according to claim 14, wherein said servo controller includes:
a servo circuit for controlling the moving means so that the second electrical signal is coincident with a servo reference signal therefor, and
second servo reference signal output means for outputting a second servo reference signal as the second electrical signal.

* * * * *